US012689332B2

(12) United States Patent (10) Patent No.: US 12,689,332 B2
Su et al. (45) Date of Patent: Jul. 21, 2026

(54) COMPENSATION CIRCUIT OF AMPLITUDE MODULATION-PHASE MODULATION, RADIO FREQUENCY POWER AMPLIFIER AND DEVICE

(71) Applicant: SMARTER MICROELECTRONICS (GUANG ZHOU) CO., LTD., Guangzhou (CN)

(72) Inventors: Qiang Su, Guangzhou (CN); Baiming Xu, Guangzhou (CN); Zhenfei Peng, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 612 days.

(21) Appl. No.: 17/929,707

(22) Filed: Sep. 4, 2022

(65) Prior Publication Data

US 2022/0416730 A1 Dec. 29, 2022

Related U.S. Application Data

(63) Continuation of application No. PCT/CN2021/134106, filed on Nov. 29, 2021.

(30) Foreign Application Priority Data

Feb. 18, 2021 (CN) .......................... 202110187468.6

(51) Int. Cl.
*H03F 1/32* (2006.01)
*H03F 1/02* (2006.01)
(Continued)

(52) U.S. Cl.
CPC ......... *H03F 1/3241* (2013.01); *H03F 1/0222* (2013.01); *H03F 1/301* (2013.01);
(Continued)

(58) Field of Classification Search
CPC ...... H03F 1/3241; H03F 1/0222; H03F 3/195; H03F 2200/451; H03F 3/245; H03F 1/301; H03F 1/3205
(Continued)

(56) References Cited

U.S. PATENT DOCUMENTS 7,167,693 B2 * 1/2007 Bachman .............. H03F 1/3229
455/341
7,259,621 B2 * 8/2007 Kusunoki ............. H03F 1/3276
330/149
(Continued)

FOREIGN PATENT DOCUMENTS

CN 101442294 A 5/2009
CN 107017852 A 8/2017
(Continued)

OTHER PUBLICATIONS

China International Search Report and Written Opinion in Application No. PCT/CN2021/134106, mailed on Feb. 21, 2022.
(Continued)

*Primary Examiner* — Andrea Lindgren Baltzell
*Assistant Examiner* — Lance Torbjorn Bartol
(74) *Attorney, Agent, or Firm* — Syncoda LLC; Feng Ma

(57) ABSTRACT

An amplitude modulation-phase modulation compensation circuit includes a detection circuit, a reconfigurable current control voltage source circuit and a phase shifting circuit, in which, the detection circuit is configured to detect the power of an input signal and output a control current according to the power of the input signal when the power of the input signal is greater than a preset power threshold; the reconfigurable current control voltage source circuit is configured to generate a bias voltage according to the control current; the phase shifting circuit is configured to compensate the AM-PM distortion of the radio frequency power amplifier (Continued)

according to the bias voltage. In this way, by the compensation circuit, when the power of the input signal is greater than a preset power threshold, the AM-PM distortion of the radio frequency power amplifier can be compensated according to the power of the input signal.

13 Claims, 10 Drawing Sheets

(51) Int. Cl.
| | | |
|---|---|---|
| *H03F 1/30* | (2006.01) | |
| *H03F 3/195* | (2006.01) | |
| *H03F 3/24* | (2006.01) | |

(52) U.S. Cl.
CPC ........... *H03F 1/3205* (2013.01); *H03F 3/195* (2013.01); *H03F 3/245* (2013.01); *H03F 2200/451* (2013.01)

(58) Field of Classification Search
USPC .................................................. 330/149, 136
See application file for complete search history.

(56) References Cited

U.S. PATENT DOCUMENTS

| | | | | | |
|---|---|---|---|---|---|
| 7,944,283 | B2 * | 5/2011 | Kim | .......................... | G05F 3/30 |
| | | | | | 327/539 |
| 9,225,364 | B1 * | 12/2015 | Usui | ..................... | H03F 1/3241 |
| 2010/0197233 | A1 * | 8/2010 | Kim | ..................... | H04B 1/7103 |
| | | | | | 455/63.1 |
| 2017/0207758 | A1 * | 7/2017 | Tseng | ......................... | H03F 1/14 |
| 2022/0247358 | A1 * | 8/2022 | Salameh | ............... | H03F 1/0233 |

FOREIGN PATENT DOCUMENTS

| | | | | | |
|---|---|---|---|---|---|
| CN | 107800391 | A | | 3/2018 | |
| CN | 110768630 | A * | 2/2020 | .......... | H03G 3/3042 |
| CN | 111865233 | A * | 10/2020 | .............. | H03F 1/02 |
| CN | 112543005 | A | | 3/2021 | |
| CN | 113452330 | A | | 9/2021 | |
| EP | 3396857 | A1 * | 10/2018 | .............. | H03F 3/19 |
| EP | 2985669 | B1 * | 1/2019 | .............. | G05F 1/46 |
| JP | 3549094 | B2 * | 8/2004 | ............. | G05F 3/245 |

OTHER PUBLICATIONS

China Notification to Grant Patent Right for Invention in Application No. 202110187468.6, mailed on May 13, 2021.
China first office action in Application No. 202110187468.6, mailed on Apr. 1, 2021.

* cited by examiner

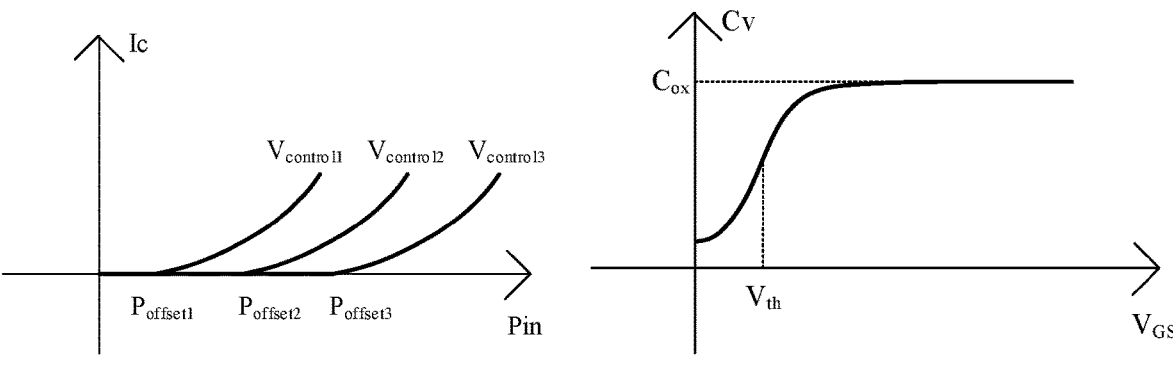

FIG. 5                         FIG. 6

```
                              ┌─ 30
┌──────────────────────────────────────────────────────────────┐
│  radio frequency                                              │
│  power amplifier          ┌─ 302                              │
│          ┌────────────────────────────────────────┐          │
│          │               Vg          bias circuit │  ┌─ 303  │
│          │      M1              R2    │            │          │
│          │  Ib        C2              │       VDD  │          │
│          │                            │            │   Cb2    │
│          │                            │            │      RFout│
│          └────────────────────────────┘            │   M2     │
│                              ┌─ 301                │          │
│  RFin ─┤├─                                  D1 (φc)│          │
│       Cb1  ┌─────────────────────────────────────┐ │  M2     │
│           │ detection   Ic  reconfigurable   Vc   │ │          │
│           │ circuit         current control  R1   │ │          │
│           │                 voltage source        │ │          │
│           │    Vcontrol     circuit      C1       │ │amplification│
│           │              Vslope                   │ │ circuit  │
│           └──── AM-PM compensation circuit ───────┘ │          │
└──────────────────────────────────────────────────────────────┘
```

FIG. 7

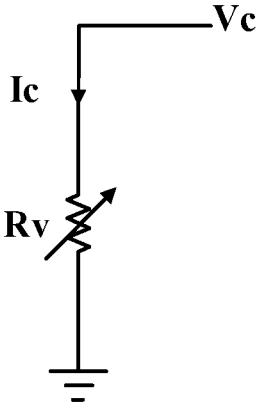
FIG. 10A
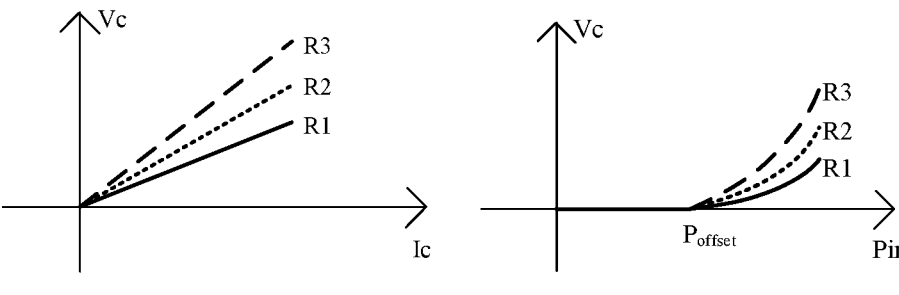
FIG. 10B                    FIG. 10C

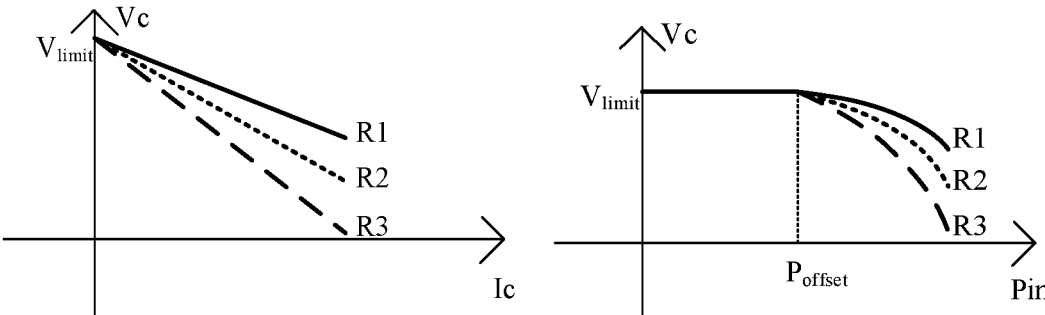
FIG. 11B                                FIG. 11C
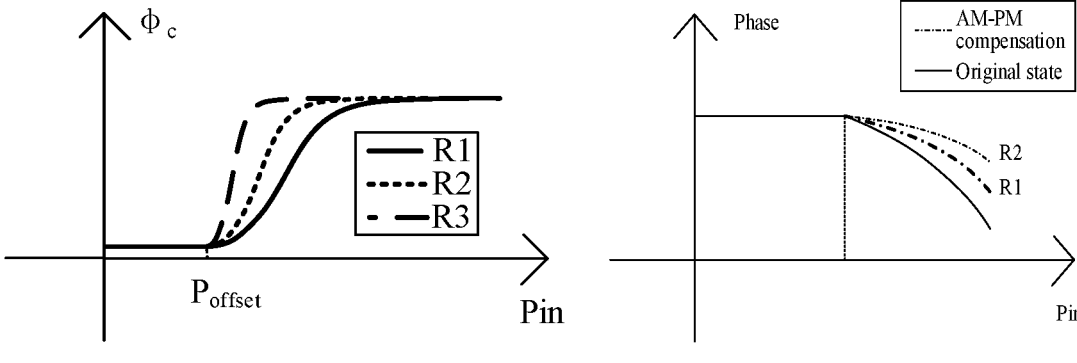
FIG. 11D                                FIG. 11E

COMPENSATION CIRCUIT OF AMPLITUDE MODULATION-PHASE MODULATION, RADIO FREQUENCY POWER AMPLIFIER AND DEVICE

CROSS-REFERENCE TO RELATED APPLICATIONS

This is a continuation of International Application No. PCT/CN2021/134106 filed on Nov. 29, 2021, which claims priority to Chinese Patent Application No. 202110187468.6 field on Feb. 18, 2021. The disclosures of the above-referenced applications are hereby incorporated by reference in their entirety.

BACKGROUND

In a mobile communication system, the efficiency and the linear power of the front-end radio frequency power amplifier have a direct effect on the energy consumption and the communication quality of the base station and the mobile terminal. The output power and the adjacent channel leakage ratio (ACLR) of the uplink modulated signal, which is amplified by the front-end power amplifier, of the terminal device must satisfy the requirements of various mobile communication protocols.

SUMMARY

The disclosure relates to the technical field of power amplifier, in particular to a compensation circuit of amplitude modulation-phase modulation, a radio frequency power amplifier and a device.

The embodiment of the disclosure provides a compensation circuit of amplitude modulation-phase modulation, a radio frequency power amplifier and a device, which can improve the ACLR performance of the radio frequency power amplifier.

The technical solutions of the embodiment of the disclosure are realized as follows.

In a first aspect, an embodiment of the disclosure provides a compensation circuit of amplitude modulation-phase modulation of a radio frequency power amplifier, the compensation circuit comprises a detection circuit, a reconfigurable current control voltage source circuit and a phase shifting circuit.

The detection circuit is configured to detect the power of an input signal and output a control current according to the power of the input signal when the power of the input signal is greater than a preset power threshold.

The reconfigurable current control voltage source circuit is configured to generate a bias voltage according to the control current.

The phase shifting circuit is configured to compensate the AM-PM distortion of the radio frequency power amplifier according to the bias voltage.

In some embodiments, the compensation circuit further comprises a first control voltage source, which is connected with the detection circuit.

The first control voltage source is configured to output a first control voltage.

The detection circuit is also configured to adjust the preset power threshold according to the first control voltage.

In some embodiments, the compensation circuit further comprises a second control voltage source, which is connected with the reconfigurable current control voltage source circuit.

The second control voltage source is configured to output a second control voltage and a third control voltage.

The reconfigurable current control voltage source circuit is further configured to control a corresponding relationship between the bias voltage and the control voltage according to the second control voltage and the third control voltage.

In some embodiments, the corresponding relationship includes an increasing function relationship or a decreasing function relationship; in which the increasing function relationship indicates that the bias voltage increases with the increase of the control current, and the decreasing function relationship indicates that the bias voltage decreases with the increase of the control current.

In some embodiments, the reconfigurable current control voltage source circuit comprises a first transistor group and a second transistor group, in which both the first transistor group and the second transistor group comprise multiple switching transistor.

The reconfigurable current control voltage source circuit is specifically configured to control that the corresponding relationship between the bias voltage and the control current is the increasing function relationship when the first transistor group is controlled to turn on according to the second control voltage and the second transistor group is controlled to turn off according to the third control voltage; or, to control that the relationship between the bias voltage and the control current is the decreasing function relationship when the first transistor group is controlled to turn off according to the second control voltage and the second transistor group is controlled to turn on according to the third control voltage.

In some embodiments, the reconfigurable current control voltage source circuit further comprises a variable resistor.

The reconfigurable current control voltage source circuit is configured to adjust the compensation degree of the compensation circuit to the AM-PM distortion of the radio frequency power amplifier by adjusting the resistance of the variable resistor.

In some embodiments, the reconfigurable current control voltage source circuit comprises at least one current mirror module which is composed of two transistors.

The reconfigurable current control voltage source circuit is configured to adjust the compensation degree of the compensation circuit to the AM-PM distortion of the radio frequency power amplifier by adjusting the area ratio of the current mirror module.

In some embodiments, the phase shifting circuit includes a phase shifting transistor.

The phase shifting circuit is specifically configured to adjust the equivalent capacitance of the phase shifting transistor according to the bias voltage and compensate the AM-PM distortion of the radio frequency power amplifier according to the equivalent capacitance.

In a second aspect, an embodiment of the disclosure provides a radio frequency power amplifier, which at least includes any one of the compensation circuits mentioned in the first aspect.

In some embodiments, the radio frequency power amplifier further comprises a bias circuit and an amplification circuit, in which the compensation circuit and the bias circuit are both connected with a signal input end of the amplification circuit.

The compensation circuit is configured to compensate the AM-PM distortion of the radio frequency power amplifier based on the input signal, to obtain the compensated input signal.

The bias circuit is configured to provide a bias current for the amplification circuit.

The amplification circuit is configured to power amplify the compensated input signal based on the bias current.

In some embodiments, the amplification circuit includes an amplification transistor; or, the amplification circuit comprises multiple amplification transistors, and the multiple amplification transistors form a stacked tube structure.

In a third aspect, an embodiment of the disclosure provides an electronic device, the electronic device at least includes any one of the radio frequency power amplifiers mentioned in the second aspect.

Various embodiments of the disclosure provide a compensation circuit of amplitude modulation-phase modulation, a radio frequency power amplifier and a device. The compensation circuit comprises a detection circuit, a reconfigurable current control voltage source circuit and a phase shifting circuit, in which, the detection circuit is configured to detect the power of an input signal and output a control current according to the power of the input signal when the power of the input signal is greater than a preset power threshold; the reconfigurable current control voltage source circuit is configured to generate a bias voltage according to the control current; the phase shifting circuit is configured to compensate the AM-PM distortion of the radio frequency power amplifier according to the bias voltage. In this way, by the cooperation of the detection circuit, the reconfigurable current control voltage source circuit and the phase shifting circuit, when the power of the input signal is greater than a preset power threshold, the AM-PM distortion of the radio frequency power amplifier can be compensated according to the power of the input signal, thereby reducing the AM-PM distortion generated during signal amplification, and improving the signal quality and the ACLR performance of the radio frequency power amplifier. Moreover, the circuit is simple, easy for integration, and meanwhile cost is reduced.

BRIEF DESCRIPTION OF THE DRAWINGS

FIG. 5 is a schematic diagram of a change curve between Ic and Pin provided by an embodiment of the disclosure;

FIG. 6 is a schematic diagram of a change curve between $C_V$ and $V_{GS}$ provided by an embodiment of the disclosure;

FIG. 7 is a schematic diagram of the circuit structure of a radio frequency power amplifier provided by the disclosure;

FIG. 10A is a schematic diagram of the simplified circuit of a reconfigurable current control voltage source circuit provided by an embodiment of the disclosure;

FIG. 10B is a schematic diagram of a change curve between $V_C$ and $I_C$ provided by an embodiment of the disclosure;

FIG. 10C is a schematic diagram of a change curve between VC and Pin provided by an embodiment of the disclosure;

FIG. 11B is schematic diagram of another change curve between $V_C$ and $I_C$ provided by an embodiment of the disclosure;

FIG. 11C is another schematic diagram of a change curve between $V_C$ and Pin provided by an embodiment of the disclosure;

FIG. 11D is another schematic diagram of a change curve between $\varphi_C$ and Pin provided by an embodiment of the disclosure;

FIG. 11E is yet another schematic diagram of a change curve between Phase and Pin provided by an embodiment of the disclosure;

DETAILED DESCRIPTION

Figure 1:
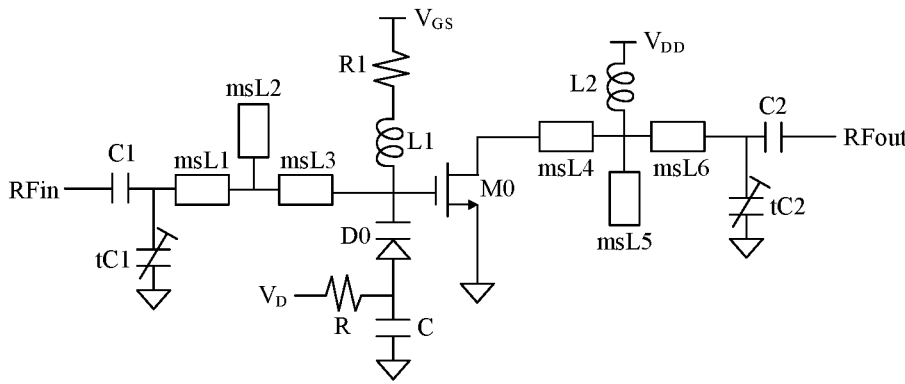
FIG. 1 is a schematic diagram of the circuit structure of an analog pre-distortion circuit provided by some implementations.

The technical solutions of the embodiments of the disclosure will be described clearly and completely below in combination with the drawings of the embodiments of the disclosure. It should be understood that the specific embodiments described herein are intended only to explain the relevant disclosure and not to limit the disclosure. In addition, it should be noted that, in order to facilitate description, only portions related to the related disclosure are shown in the drawings.

Unless otherwise defined, all technical and scientific terms used herein have the same meaning as commonly understood by those skilled in the art of the present disclosure. The terms used herein is for the purpose of describing embodiments of the disclosure only and is not intended to limit the disclosure.

In the following description, reference is made to "some embodiments" that describe a subset of all possible embodiments, but it should be understood that "some embodiments" may be the same subset or different subsets of all possible embodiments and may be combined with each other without conflict.

It should be pointed out that, the terms "first\ second\ third" are used in embodiments of the disclosure only to distinguish similar objects, without representing a particular ordering of objects, it should be understood that the "first\ second\ third" may be interchanged in a particular order or sequence, so that embodiments of the disclosure described herein are enabled to be implemented in an order other than that illustrated or described herein.

In a memoryless system, the ACLR performance of a radio frequency power amplifier (RFPA) can be characterized by amplitude modulation-amplitude modulation (AM-AM) distortion and amplitude modulation-phase modulation (AM-PM) distortion of the RFPA. The greater the change rate of the AM-AM distortion and the AM-PM distortion with an input signal, the worse the ACLR performance of the output signal of a RFPA. The source of the AM-PM distortion is mainly the nonlinearity of a transistor itself. With the increase of the input power, the output phase of a radio frequency power amplifier will change, and thus clutter interference is generated, leading to the deterioration of the ACLR performance.

With the continuous development of wireless communication technologies, radio frequency (RF) technology has been widely used. Radio frequency power amplifier (RFPA) is an indispensable key device in various wireless transmitters. In an ideal linear RFPA, the phase difference between the output signal and the input signal should be zero or a constant, that is, the output signal is only the input signal after amplitude amplification and adding a certain delay. However, in an actual RFPA, due to the nonlinearity of the transistor itself, the RFPA has the problem of AM-PM distortion, that is, the phase difference between the output signal and the input signal changes.

At present, there are many methods to improve the AM-PM distortion of an power amplifier, as an example, envelope tracking, digital pre-distortion and other digital compensation methods, which have good effects, but need cooperation of external chip, having the high cost and complex control; in addition, the negative feedback linearization technology has effects on the stability of an amplifier and deteriorates its gain; feedforward technology is unconditionally stable and can completely eliminate nonlinear distortion components in theory, but it has high complexity; analog pre-distortion technology aiming at correcting the input signal of an amplifier has low cost and high pre-distortion efficiency, because it only needs to add a phase shifter, a capacitor, a resistor and other devices around the power amplifier and adjust them, and it has a simple structure and wide working bandwidth.

Referring to FIG. 1, it illustrates a schematic diagram of the circuit structure of an analog pre-distortion circuit provided by some implementations. As shown in FIG. 1, where RFin is the signal input end; RFout is the signal output end; C, C1 and C2 are capacitors; tC1 and tC2 are trimming capacitors; msL1, msL2, nsL3, msL4, msL5 and msL6 are microstrip lines; R and R1 are resistors; L1 and L2 are inductors; D0 is a varactor diode; M0 is a power transistor; $V_{GS}$, $V_D$, $V_{DD}$ are the power supply.

By adding a phase compensation circuit composed of a varactor diode D0 to ground at the input end of the power transistor M0, the bias voltage of D0 is supplied by the bias circuit composed of a bias voltage source $V_D$, a filter capacitor C and a radio frequency isolation resistor R. The operation principle of the analog pre-distortion circuit shown in FIG. 1 is as follows: since the non-linear capacitance of M0, i.e. the gate-source capacitance (denoted by Cgs), is one of the sources of the AM-PM distortion, for example, when the operating region of the amplifier changes from the cut-off state to the saturation region, Cgs will increase with the increase of the input power. Assuming that the capacitance of D0 (denoted by $C_{D0}$) has a similar nonlinear characteristic to Cgs under a large signal, as long as the bias voltage of D0 is opposite to the gate voltage, the varactor diode D0 could produce a non-linear characteristic opposite to Cgs, thereby ensuring that the total gate-to-ground capacitance (denoted by Cc) remains unchanged under different input powers, and finally realizing AM-PM compensation.

Figure 2:
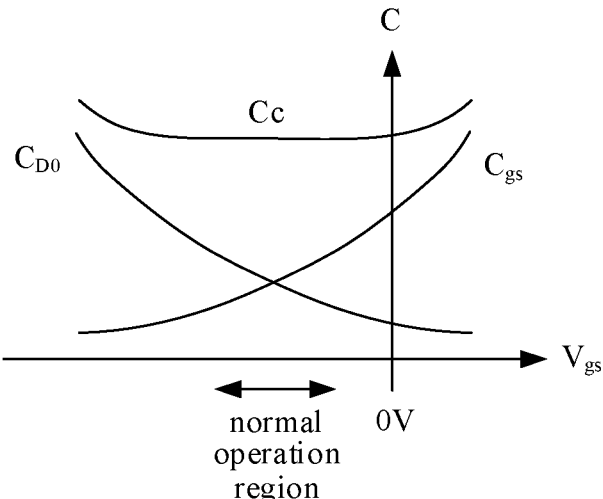
FIG. 2 is a schematic diagram of a change curve of Cgs, $C_{D0}$ and $C_C$ and Vgs provided by some implementations.

Referring to FIG. 2, it illustrates a schematic diagram of a change curve of Cgs, $C_{D0}$ and $C_C$ and Vgs provided by some implementations when the analog pre-distortion circuit shown in FIG. 1 performs AM-PM compensation. As shown in FIG. 2, since of DO with a similar non-linear characteristic to the non-linear capacitance Cgs of M0 in the circuit is introduced, the total capacitance Cc is substantially stable in the normal operation region.

However, the circuit has the following defects: firstly, it is difficult to find a varactor diode D0 with a similar non-linear characteristic to the non-linear capacitor Cgs of the power tube M0; second, the circuit only compensates for the non-linear Cgs of M0, while other non-linear parameters such as gate-drain capacitance (expressed by Cgd), transconductance (expressed by gm) and the like are ignored, so only limited AM-PM compensation can be achieved, and the compensation degree of AM-PM is not adjustable; third, the compensation circuit is normally open, which increases unnecessary power consumption.

Based on this, the embodiment of the disclosure provides a compensation circuit of amplitude modulation-phase modulation of a radio frequency power amplifier. The compensation circuit comprises a detection circuit, a reconfigurable current control voltage source circuit and a phase shifting circuit, in which, the detection circuit is configured to detect the power of an input signal and output a control current according to the power of the input signal when the power of the input signal is greater than a preset power threshold; the reconfigurable current control voltage source circuit is configured to generate a bias voltage according to the control current; the phase shifting circuit is configured to compensate the AM-PM distortion of the radio frequency power amplifier according to the bias voltage. In this way, by the cooperation of the detection circuit, the reconfigurable current control voltage source circuit and the phase shifting circuit, when the power of the input signal is greater than a preset power threshold, the AM-PM distortion of the radio frequency power amplifier can be compensated according to the power of the input signal, thereby reducing the AM-PM distortion generated during signal amplification, and improving the signal quality and the ACLR performance of the radio frequency power amplifier. Moreover, the circuit is simple, easy for integration, and meanwhile cost is reduced.

The embodiments of the disclosure will be further described in detail below in combination with the drawings.

Figure 3:
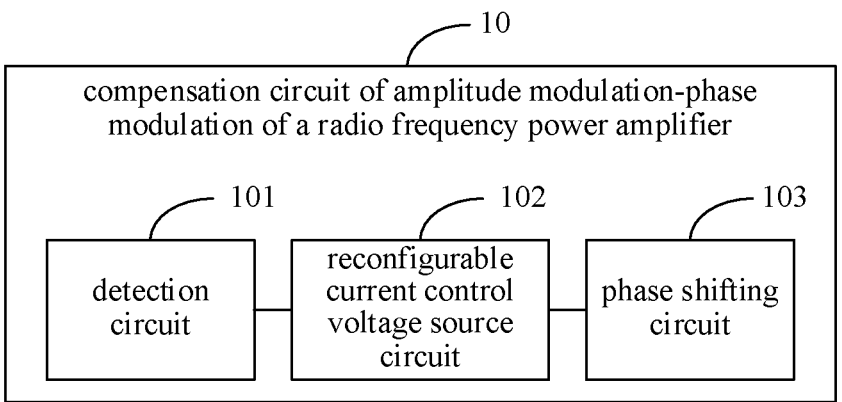
FIG. 3 is a schematic diagram of the structure of a compensation circuit of amplitude modulation-phase modulation of a radio frequency power amplifier provided by an embodiment of the disclosure.

In an embodiment of the disclosure, referring to FIG. 3, a schematic diagram of the structure of a compensation circuit of amplitude modulation-phase modulation of a radio frequency power amplifier provided by an embodiment of the disclosure is illustrated. As shown in FIG. 3, the compensation circuit of amplitude modulation-phase modulation of a radio frequency power amplifier may comprise a detection circuit 101, a reconfigurable current control voltage source circuit 102 and a phase shifting circuit 103.

The detection circuit 101 is configured to detect the power of an input signal and output a control current according to the power of the input signal when the power of the input signal is greater than a preset power threshold.

The reconfigurable current control voltage source circuit 102 is configured to generate a bias voltage according to the control current.

The phase shifting circuit 103 is configured to compensate the amplitude modulation-phase modulation distortion of the radio frequency power amplifier according to the bias voltage.

It should be noted that, the compensation circuit of amplitude modulation-phase modulation of a radio frequency power amplifier provided by an embodiment of the disclosure may be a part of the radio frequency power amplifier. The radio frequency power amplifier is configured to amplify the input signal. The compensation circuit 10 of amplitude modulation-phase modulation of the radio frequency power amplifier can be connected with the input end of the radio frequency power amplifier to implement phase compensation to the input signal so that the phase of the input signal changes opposite to the phase distortion of the output signal to improve the AM-PM distortion of the radio frequency power amplifier. Thus, the compensation circuit of amplitude modulation-phase modulation of the radio frequency power amplifier provided by an embodiment of the disclosure may be referred to as an AM-PM compensation circuit.

In an embodiment of the disclosure, the detection circuit 101 firstly detects the power of an input signal and compares the power of the input signal with a preset power threshold, when the power of the input signal is determined to be greater than a preset power threshold, the detection circuit 101 outputs the corresponding control current according to the power of the input signal.

It should be noted that the preset power threshold represents the power point at which compensation is turned on, that is, the AM-PM compensation circuit performs compensation work only when the power of the input signal is greater than the preset power threshold, and outputs a control current corresponding to the power of the input signal through the detection circuit 101; the voltage output by the reconfigurable current control voltage source circuit 102 is affected by the control current, when the reconfigurable current control voltage source circuit 102 receives the control current, it will output a bias voltage corresponding to the control current; when the bias voltage is acted on the phase shifting circuit 103, the phase shifting circuit 103 compensates the input signal according to the bias voltage, so that the phase of the input signal changes opposite to the phase distortion of the output signal of the RFAP, thereby compensating the AM-PM distortion; in this way, the AM-PM compensation is finally realized by the cooperation of the detection circuit 101, the reconfigurable current control voltage source circuit 102 and the phase shifting circuit 103.

Figure 4:
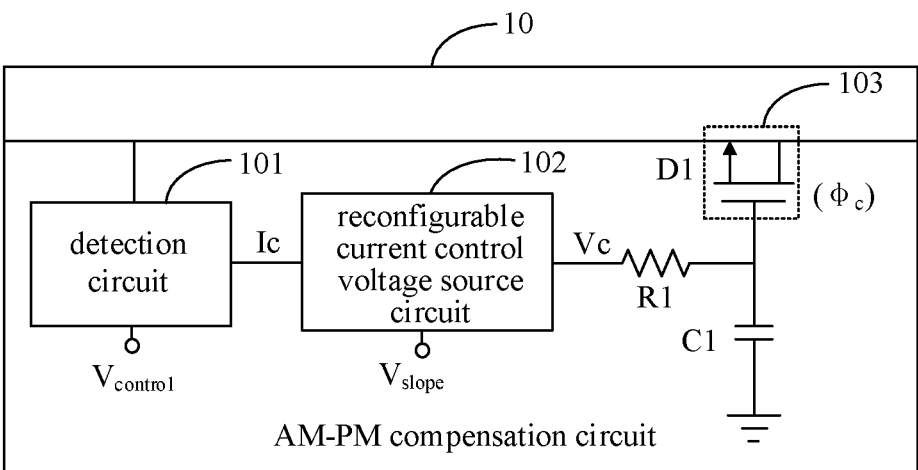
FIG. 4 is a schematic diagram of the specific structure of a compensation circuit of amplitude modulation-phase modulation of a radio frequency power amplifier provided by an embodiment of the disclosure.

In some embodiments, on the basis of an example of the compensation circuit structure shown in FIG. 3, referring to FIG. 4, a schematic diagram of the specific structure of an AM-PM compensation circuit 10 provided by an embodiment of the disclosure is illustrated. As shown in FIG. 4, the compensation circuit further comprises a first control voltage source, which is connected with the detection circuit 101.

The first control voltage source is configured to output a first control voltage.

The detection circuit 101 is also configured to adjust the preset power threshold according to the first control voltage.

It should be noted that, in FIG. 4, the first control voltage source is represented by Vcontrol.

It should further be noted that, in the embodiment of the disclosure, the detection circuit 101 can adjust the preset power threshold by changing the first control voltage output by the first control voltage source, thereby changing the power point at which the compensation of the AM-PM compensation circuit is turned on.

Exemplarily, referring to FIG. 5, a schematic diagram of a change curve between a control current and the power of an input signal provided by an embodiment of the disclosure is illustrated. As shown in FIG. 5, Pin is the power of the input signal, and $I_C$ is the control current. In FIG. 5, when the first control voltage is Vcontrol1, Vcontrol2 and Vcontrol3 respectively, the power point at which the compensation of the AM-PM compensation circuit is turned on is Poffset1, Poffset2 and Poffset3, respectively. At this time, the power point at which the compensation is turned on (such as Poffset1, Poffset2 and Poffset3) is the preset power threshold (which can be represented by Poffset), when the first control voltage is different, the preset power threshold has different value.

It is taken as an example that the first control voltage is Vcontrol2, when Pin<Poffset2, since the power of the input signal does not reach the power point at which the compensation is turned on, the detection circuit 101 only detects the power of the input signal and does not output the control current; when Pin≥Poffset2, the power of the input signal reaches the power point at which the compensation is turned on, and after Pin≥Poffset2, the detection circuit 101 outputs the control current that increases as the power of the input signal increases. It should be noted that when Pin=Poffset2, the compensation is turned on at this time, but the power value corresponding to the input signal is Poffset2, and the control current is still 0. That is, when the power of the input signal is equal to the preset power threshold, it means that the compensation is turned on, but is not started for the power point, and the AM-PM compensation circuit will perform compensation only when the power of the input signal is greater than the preset power threshold.

In an embodiment of the disclosure, the preset power threshold is controlled and set by the first control voltage. By regulating the first control voltage, the AM-PM compensation circuit may turn on compensation at different power points. It can also be understood that the compensation circuit can operate in the power range of (Poffset, Plimit) by controlling the first control voltage. Here, Plimit may be infinitely large in theory, but in fact, as the power of the input signal increases, for different circuits, when the power of the input signal increases to a certain value, the compensation of the compensation circuit will reach the limit. At this time, if the power of the input signal continues to increase, it is difficult for the circuit to make more effective compensation. Therefore, Plimit may be the power value of the input signal corresponding to the first control voltage when or after reaching the limit state of compensation.

That is, after the power of the input signal exceeds a specific value (i.e., a preset power threshold Poffset), the detection circuit 101 provides the control current that varies with the power of the input signal, and the preset power threshold may be adjusted by the first control voltage; that is, the detection circuit 101 determines the power point at which the AM-PM compensation is turned on.

It should be noted that, the preset power threshold is adjusted by the first control voltage. Specifically, the preset power threshold increases with the increase of the first control voltage, or decreases with the increase of the first control voltage, or the preset power threshold is controlled by a logic control signal output by the first control voltage source, which is not specifically limited here. Exemplarily, in a case that the preset power threshold is controlled by the logic control signal output by the first control voltage source, when Vcontrol=00, Poffset=−10 dBm; when Vcontrol=01, Poffset=−5 dBm; when Vcontrol=10, Poffset=−2.5 dBm; when Vcontrol=11, Poffset=0 dBm. It should also be noted that, the manner and the specific values of adjusting the preset power threshold by the first control voltage and the specific values are only exemplary and do not constitute a limitation to the disclosure. That is, a person skilled in the art can set the first control voltage according to the actual demand, so that the AM-PM compensation circuit starts compensation at different power points, which is not specifically limited here.

In some embodiments, as shown in FIG. 4, the AM-PM compensation circuit 10 further comprises a second control voltage source, which is connected with the reconfigurable current control voltage source circuit 102.

The second control voltage source is configured to output a second control voltage and a third control voltage.

The reconfigurable current control voltage source circuit 102 is further configured to control the corresponding relationship between the bias voltage and the control current according to the second control voltage and the third control voltage.

Specifically, the corresponding relationship may include an increasing function relationship or a decreasing function relationship; in which the increasing function relationship indicates that the bias voltage increases with the increase of the control current, and the decreasing function relationship indicates that the bias voltage decreases with the increase of the control current.

It should be noted that, in FIG. 5, the second control voltage source is represented by Vslope.

It should also be noted that, the reconfigurable current control voltage source circuit 102 can control the corresponding relationship between the bias voltage and the control voltage according to the second control voltage Vslope2 and the third control voltage Vslope3 output by the second control voltage source. Exemplarily, when the second control voltage is a turn-on voltage and the third control voltage is a turn-off voltage, the corresponding relationship between the bias voltage and the control current is an increasing function relationship, and the bias voltage increases with the increase of the control current, at this time, the operation mode of the reconfigurable current control voltage source circuit 102 is an increasing function mode; when the second control voltage is the turn-off voltage and the third control voltage is the turn-on voltage, the corresponding relationship between the bias voltage and the control current is a decreasing function relationship, and the bias voltage decreases with the increase of the control current, at this time, the operation mode of the reconfigurable current control voltage source circuit 102 is a decreasing function mode.

It should also be noted that, when the reconfigurable current control voltage source circuit 102 is a logic control circuit, the reconfigurable current control voltage source circuit 102 can also control the corresponding relationship between the bias voltage and the control current according to the logic control signal output by the second control voltage source. Exemplarily, when the logic control signal output by the second control voltage source is "1", the reconfigurable current control voltage source circuit 102 operates in an increasing function mode, at this time, the corresponding relationship between the bias voltage and the control current is an increasing function relationship, and the bias voltage increases as the control current increases; when the logic control signal output by the second control voltage source is "0", the reconfigurable current control voltage source circuit 102 operates in a decreasing function mode, at this time, the corresponding relationship between the bias voltage and the control current is a decreasing function relationship, and the bias voltage decreases with the increase of the control current.

In some embodiments, as shown in FIG. 4, the phase shifting circuit 103 may include a phase shifting transistor D1.

The phase shifting circuit 103 is specifically configured to adjust the equivalent capacitance of the phase shifting transistor D1 according to the bias voltage; and the AM-PM distortion of the radio frequency power amplifier is compensated according to the equivalent capacitance.

It should be noted that, as shown in FIG. 4, the AM-PM compensation circuit 10 may further include a bias circuit composed of a reconfigurable current control voltage source circuit 102, a resistor R1, and a capacitor C1. Herein, one end of the resistor R1 is connected with the reconfigurable current control voltage source circuit 102, and the other end is connected with the gate of the phase shifting transistor D1; one end of the capacitor C1 is connected with the gate of D1, and the other end of the capacitor C1 is grounded; the drain and source of D1 is short circuit. Herein, the phase shifting transistor D1 serving as a variable capacitor constitutes a phase shifting circuit 103; the bias circuit of D1 consisting of a reconfigurable current control voltage source circuit 102, the resistor R1 and the capacitor C1 is configured to supply a bias voltage for D1. Since the bias voltage is the gate bias voltage of D1, in the embodiments of the disclosure, the bias voltage $V_C$ provided by the reconfigurable current control voltage source circuit 102 is the gate voltage $V_{GS}$ of D1 in the phase shifting circuit 103, that is, $V_C=V_{GS}$. In addition, the capacitor C1 is the filter capacitor, which can filter out the interference of the radio frequency signal, and meanwhile the capacitor C1 provides a path to ground for D1; and the resistor R1 is the radio frequency isolation resistor. Here, the compensation phase introduced by D1 decreases with the increase of the equivalent capacitance of D1, and the equivalent capacitance varies with the gate voltage of D1. It should also be noted that the equivalent capacitance of D1 represents the overall capacitance of D1 when D1 operates as a variable capacitor in the AM-PM compensation circuit, and not only represents the gate-source capacitance (denoted by Cgs) or the gate-drain capacitance (denoted by Cgd) of the transistor.

Referring to FIG. 6, a schematic diagram of a change curve between the equivalent capacitance of D1 and the gate voltage thereof provided by an embodiment of the disclosure is illustrated. As shown in FIG. 6, $V_{GS}$ is the gate voltage, $C_V$ is the equivalent capacitance of D1. In FIG. 6, Vth is the threshold voltage, which represents the gate voltage when D1 is in the critical conduction state; Cox is the gate capacitance per unit area, which is related to the properties of D1 itself. When the equivalent capacitance reaches Cox, and the gate voltage is increased at this time, the equivalent capacitance will not change, that is, after exceeding this range, effective compensation cannot be achieved. At this time, the first control voltage can be adjusted to change the power point, i.e. the preset power threshold, at which the compensation of the AM-PM compensation circuit is turn on, so that the effective compensation for the AM-PM distortion can be maintained.

The embodiment of the disclosure provides a compensation circuit of amplitude modulation-phase modulation. The compensation circuit comprises a detection circuit, a reconfigurable current control voltage source circuit and a phase shifting circuit, in which, the detection circuit is configured to detect the power of an input signal and output a control current according to the power of the input signal when the power of the input signal is greater than a preset power threshold; the reconfigurable current control voltage source circuit is configured to generate a bias voltage according to the control current; the phase shifting circuit is configured to compensate the amplitude modulation-phase modulation AM-PM distortion of the radio frequency power amplifier according to the bias voltage. In this way, by the cooperation of the detection circuit, the reconfigurable current control voltage source circuit and the phase shifting circuit, when the power of the input signal is greater than the preset power threshold, the AM-PM distortion of the radio frequency power amplifier can be compensated according to the power of the input signal, thereby reducing the AM-PM distortion generated during signal amplification, and improving the signal quality and the ACLR performance of the radio frequency power amplifier. Moreover, the circuit is simple, easy for integration, and meanwhile cost is reduced.

In another embodiment of the disclosure, referring to FIG. 7, a schematic diagram of the circuit structure of a radio frequency power amplifier provided by an embodiment of the disclosure is illustrated. As shown in FIG. 7, the radio frequency power amplifier 30 may include an AM-PM compensation circuit 301.

In the embodiment of the disclosure, the AM-PM compensation circuit 301 may be the AM-PM compensation circuit 10 described in any one of the preceding embodiments.

Further, in some embodiment, as shown in FIG. 7, the radio frequency power amplifier 30 further comprises a bias circuit 302 and an amplification circuit 303, in which both the compensation circuit 301 and the bias circuit 302 are connected with the signal input end of the amplification circuit 303.

The compensation circuit 301 is configured to compensate the AM-PM distortion of the radio frequency power amplifier based on the input signal, to obtain the compensated input signal.

The bias circuit 302 is configured to provide a bias current for the amplification circuit 303.

The amplification circuit 303 is configured to power amplify the compensated input signal based on the bias current.

As shown in FIG. 7, RFin is the signal input end; RFout is the signal output end; Cb1, Cb2, C1 and C2 are capacitors; R1 and R2 are resistors; D1, M1 and M2 are transistors; Ib is a current source; VDD is a voltage source; Vcontrol is a first control voltage source, and Vslope is a second control voltage source.

It should be noted that, in FIG. 7, the detection circuit, the reconfigurable current control voltage source circuit, the resistor R1, the capacitor C1, the first control voltage source Vcontrol, the second control voltage source Vslope and the phase shifting transistor D1 constitute the AM-PM compensation circuit 301; the current source Ib, the transistor M1, the capacitor C2 and the resistor R2 constitute the bias circuit 302 for supplying a bias current to the amplification circuit; the amplification transistor M2, the capacitor Cb2 and the power supply VDD constitute the amplification circuit 303 for power amplification.

In an embodiment of the disclosure, the phase shifting transistor D1 may preferably be a metal oxide semiconductor field effect transistor (MOS transistor) whose equivalent capacitor is referred to as the MOS capacitor.

In short, the radio frequency power amplifier provided by the embodiment of the disclosure may include an AM-PM compensation circuit. The AM-PM compensation circuit is an AM-PM compensation circuit based on the MOS capacitor, the detection circuit and the reconfigurable current control voltage source circuit, and can realize the programmability of the power point at which the AM-PM compensation is turn on and the change rate of the AM-PM with an input signal, thereby improving the ACLR of the power amplifier. Taking FIG. 7 as an example, the AM-PM compensation circuit may include the following three parts.

The first part is the phase shifting circuit composed of the MOS transistor D1 serving as a capacitor. The bias voltage of the MOS transistor D1 may be provided by the bias circuit composed of an output voltage (a bias voltage) of the reconfigurable current control voltage source circuit, the filter capacitor C1 and the radio frequency isolation resistor R1; at the same time, the C1 provides the path to ground for the D1, and the compensation phase introduced by the D1 decreases with the increase of the equivalent capacitance of the D1, and the equivalent capacitance varies with the gate voltage of the D1.

The second part is the detection circuit that provides the control current varying with the power of the input signal when the input power exceeds a specific value (i.e., a preset power threshold Poffset), and the preset power threshold may be adjusted by the first control voltage; the detection circuit 101 determines the power point at which the AM-PM compensation is turned on.

The third part is the reconfigurable current control voltage source circuit which can make the output voltage (i.e. the bias voltage) and the input current (i.e. the control current) have a relationship of an increasing function or a decreasing function, and the proportionality coefficient of the bias voltage and the control current is adjustable; the reconfigurable current control voltage source circuit provides D1 with a variable bias voltage related to the power of the input signal, which makes the phase introduced by D1 variable under different input powers, thereby realizing the programmability of the change rate of AM-PM with the input power.

Figure 8:
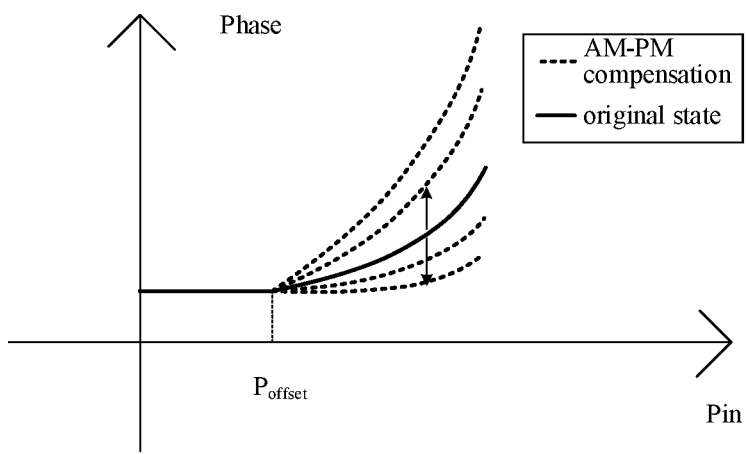
FIG. 8 is a schematic diagram of a change curve between Phase and Pin provided by an embodiment of the disclosure.

Exemplarily, referring to FIG. 8, a schematic diagram of a change curve between the phase of the input signal amplified by a radio frequency power amplifier and the power of the input signal, provided by an embodiment of the disclosure is illustrated. As shown in FIG. 8, Pin is the power of the input signal, and Phase is the phase of the output signal. In FIG. 8, original state represents that the curve is a Phase-Pin change curve obtained without AM-PM compensation (as indicated by a bold black curve), and above the curve, the phase of the output signal changes positively after the AM-PM distortion state is positively compensated; below the curve, after the AM-PM distortion state is negatively compensated, the phase of the output signal changes negatively. Because the operation mode (the increasing function mode or the decreasing function mode) of the reconfigurable current control voltage source circuit determines whether the compensation phase changes in the same direction or in the opposite direction with the power of the input signal, proper selection of the operation mode of the reconfigurable current control voltage source circuit can realize the AM-PM compensation under different situations of AM-PM distortion.

It should also be noted that, in the embodiment of the disclosure, the AM-PM compensation is realized by making the phase of the input signal change opposite to the phase distortion of the output signal. Because the phase change of the input signal is the compensation phase introduced by the phase shifting transistor D1, and the compensation phase changes with the gate voltage of the D1, different degrees of phase compensation can be carried out by reasonably controlling the gate voltage (i.e. the bias voltage), thereby realizing the adjustability of the change rate of the AM-PM with the input signal. The AM-PM here represents the phase of the output signal and in this disclosure, is denoted by Phase as well.

Understandably, if the change rate of the AM-PM with the input signal is smaller, it means the AM-PM distortion generated is smaller when comparing the amplified output signal and the input signal, that is, the compensation effect is better.

In this way, in the embodiment of the disclosure, if the power of the input signal is not greater than the preset power threshold, it means that the power of the input signal is smaller at this time, and the signal with a smaller power generally does not generate obvious AM-PM distortion, so it is unnecessary to AM-PM compensate for the input signal. At this time, since there is no compensation, the equivalent capacitance of the phase shifting transistor will not change, and the compensation phase introduced by the phase shifting transistor will not change, so that the influence of the phase shifting transistor on the input signal is to introduce a fixed phase.

The specific circuit structure of the reconfigurable current control voltage source circuit will be described in detail below.

In some embodiments, the reconfigurable current control voltage source circuit may comprise a first transistor group and a second transistor group, in which both the first transistor group and the second transistor group comprise multiple switching transistors.

The reconfigurable current control voltage source circuit is specifically configured to control that the relationship between the bias voltage and the control current is the increasing function relationship when the first transistor group is controlled to turn on according to the second control voltage and the second transistor group is controlled to turn off according to the third control voltage; or, the relationship between the bias voltage and the control current is the decreasing function relationship when the first transistor group is controlled to turn off according to the second control voltage and the second transistor group is controlled to turn on according to the third control voltage.

In a possible embodiment, the reconfigurable current control voltage source circuit may comprise a variable resistor.

The reconfigurable current control voltage source circuit is configured to adjust the compensation degree of the compensation circuit to the AM-PM distortion of the radio frequency power amplifier by adjusting the resistance of the variable resistor.

Figure 9:
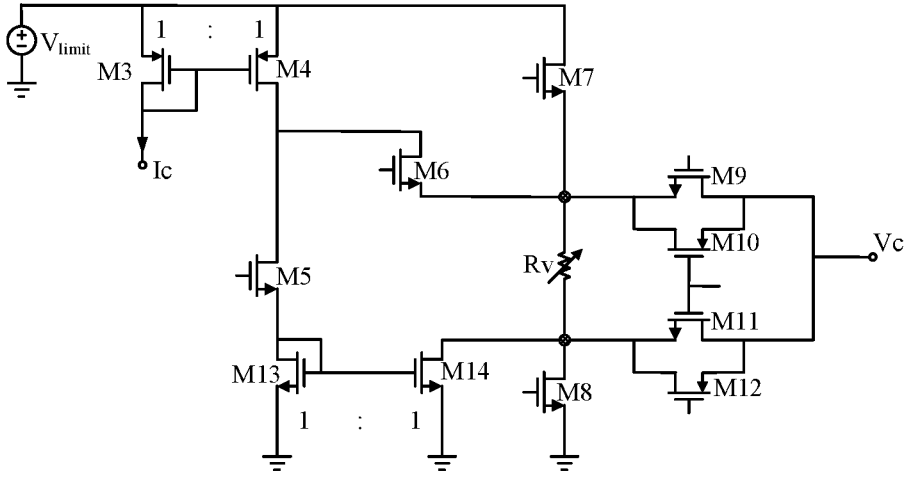
FIG. 9 is a schematic diagram of the specific structure of a reconfigurable current control voltage source circuit provided by an embodiment of the disclosure.

Exemplarily, referring to FIG. 9, a schematic diagram of the specific structure of a reconfigurable current control voltage source circuit provided by an embodiment of the disclosure is illustrated. As shown in FIG. 9, $V_{Limit}$ is the power supply, in which the positive electrode of the power supply is connected with the source electrode of the transistors M3 and M4 and the drain electrode of the transistor M7, and the negative electrode of the power supply is grounded; the drain and the gate of the transistor M3 and the gate of the M4 are connected to the output end of the detection circuit (not shown), and the transistors M3 and M4 constitute a 1:1 current mirror; the drain of the transistor M4 is connected with the drains of the transistors M5 and M6; the source of the transistor M5 is connected with the drain of the transistor M13, and the source of the transistor M13 is grounded, and the source and the gate of the transistor M13 are shorted; the gates of the transistors M13 and M14 are in connected, the sources of the transistor M14 is grounded, and the transistors M13 and M14 constitute a 1:1 current mirror; the sources of the transistors M6, M7, M9 and the drain of the transistor M10 are connected to one end of the variable resistor $R_V$, and the drains of the transistors M14, M8 and M11 and the source of the transistor M11 are connected to the other end of the variable resistor $R_V$; the drains of the transistors M9 and M11 and the sources of the transistors M10 and M12 are connected to one end of the radio frequency isolation resistor (not shown); the gates of transistors M10 and M11 are in connected.

The transistors M5-M12 are switching transistors, $R_V$ is a variable resistor and Vp and Vn represent the gate voltage of each transistor, respectively. In an embodiment of the disclosure, the first transistor group may include the transistors M6, M8, M9, M10, and the second transistor group may include the transistors M5, M7, M11, M12.

In the reconfigurable current control voltage source circuit shown in FIG. 9, when the first transistor group is controlled to turn on by the second control voltage and the second transistor group is controlled to turn off by the third control voltage. Here, the second control voltage may be Vp and the third control voltage may be Vn, for example, Vp is controlled to be a high voltage and Vn is controlled to be a low voltage, where the high voltage refers to a higher voltage that can turn on the transistors M6, M8 and M9 and turn off the transistor M12 at the same time, such as 2.5 V or 3V, but is not specifically limited; Here, the low voltage here refers to a lower voltage that can turn off the transistors M5, M7, M11 and turn on the transistor M10 at the same time, such as 0V, but is not specifically limited. At this time, the first transistor group M6, M8, M9 and M10 is turned on, and the second transistor group M5, M7, M11 and M12 is turned off. The simplified equivalent circuit diagram of the reconfigurable current control voltage source circuit shown in FIG. 9 is shown as FIG. 10A, the reconfigurable current control voltage source circuit operates in an increasing function mode, and its output bias voltage satisfies equation (1). Herein, $V_C$ is a bias voltage, $R_V$ is the resistance of a variable resistor, and $I_C$ is a control current.

$$V_C = R_V \times I_C \qquad (1)$$

Referring to FIG. 10B, a schematic diagram of the change curve of the bias voltage and the control current when the reconfigurable current control voltage source circuit operates in an increasing function mode is illustrated. As shown in FIG. 10B, $I_C$ is the control current, $V_C$ is the bias voltage; R3>R2>R1, VC≤$V_{Limit}$, and the value of $V_{Limit}$ may be some value of the gate voltage, when the equivalent capacitance reaches Cox in FIG. 6. In FIG. 10B, when the resistance of the variable resistor is constant, the bias voltage increases as the control current increases. When the control current is constant, the larger the resistance of the variable resistor, the greater the bias voltage, and the resistance of the variable resistor is the slope of the straight line, that is, the proportional coefficient between the bias voltage and the control current can be adjusted by the variable resistor.

It could be understood that from the foregoing, there is a corresponding relationship between the control current and the power of the input signal, and there is a corresponding relationship between the bias voltage and the control current, and thus the corresponding relationship between the bias voltage and the power of the input signal can be obtained. Referring to FIG. 10C, a schematic diagram of the change curve of the bias voltage and the power of the input signal when the reconfigurable current control current source circuit operates in an increasing function mode is illustrated. As shown in FIG. 10C, Pin is the power of the input signal, and $V_C$ is the bias voltage. In FIG. 10C, when the resistance of the variable resistor is constant, after Pin>Poffset, the bias voltage increases with the increase of the power of the input signal; when the power of the input signal is constant, the greater the resistance of the variable resistor, the greater the bias voltage.

Figures 10D, 10E:
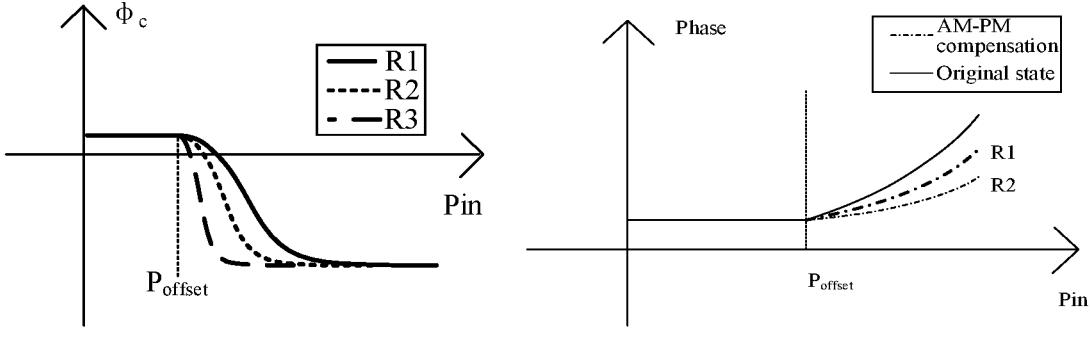
FIG. 10D is a schematic diagram of a change curve between $\varphi_C$ and Pin provided by an embodiment of the disclosure.
FIG. 10E is schematic diagram of another change curve between Phase and Pin provided by an embodiment of the disclosure.

It could be understood that from the foregoing, the equivalent capacitance of the phase shifting transistor varies with the gate voltage (the bias voltage) thereof, the compensation phase introduced by the phase shifting transistor decreases with the increase of the equivalent capacitance of the phase shifting transistor, and there is a corresponding relationship between the bias voltage and the power of the input signal, so that a corresponding relationship between the compensation phase and the power of the input signal can be obtained. Referring to FIG. 10D, a schematic diagram of the change curve of the compensation phase and the power of the input signal when the reconfigurable current control current source circuit operates in an increasing function mode is illustrated. As shown in FIG. 10D, Pin is the power of the input signal, and $\varphi_C$ is the compensation phase. In FIG. 10D, when the resistance of the variable resistor is constant, after Pin>Poffset, within the compensation range, the compensation phase decreases with the increase of the power of the input signal, that is, the compensation phase changes inversely with the power of the input signal; when the power of the input signal is constant, the larger the resistance of the variable resistor, the smaller the compensation phase.

Understandably, in the embodiment of the disclosure, the control current is determined based on the power of the input signal, the bias voltage is determined based on the control current, the equivalent capacitance is determined based on the bias voltage, the compensation phase is determined based on the equivalent capacitance, then the phase of the input signal is compensated by the compensation phase, and the compensated input signal is amplified by the radio frequency power amplifier to obtain the output signal. Referring to FIG. 10E, a schematic diagram of the change curve between the phase of the output signal and the power of the input signal when the reconfigurable current control voltage source circuit operates in an increasing function mode is illustrated. As shown in FIG. 10E, Pin is the power of the input signal, and Phase is the phase of the output signal. Understandably, in an ideal state, the phase of the output signal should be kept constant, but due to the AM-PM distortion, in some cases, as the power of the input signal increases, the phase of the output signal will shift in a positive direction. In FIG. 10E, after Pin>Poffset, in the original state without compensation, Phase-Pin curve is shown as "upwarping". Because the AM-PM compensation circuit provided in the embodiment of the disclosure compensates the input signal before the signal is amplified, the phase of the input signal changes opposite to the phase distortion of the output signal, so that the phase of the output signal can be "pulled down" to make it closer to the ideal state. In FIG. 10E, R2>R1, and the Phase-Pin curve corresponding to R2 has a greater "pulled down" degree than that corresponding to R1, and the curve is closer to the ideal state, that is, the greater the resistance of the variable resistor, the greater the compensation degree of the AM-PM compensation circuit.

Figure 11A:
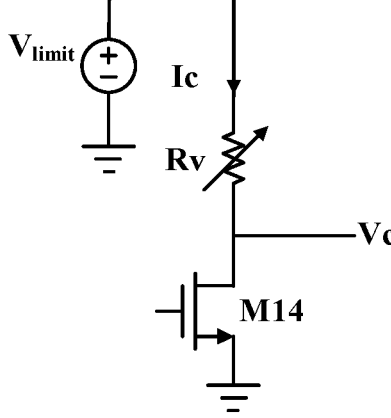
FIG. 11A is schematic diagram of the simplified circuit of another reconfigurable current control voltage source circuit provided by an embodiment of the disclosure.

In the reconfigurable current control voltage source circuit shown in FIG. 9, when the first transistor group is controlled to turn off by the second control voltage and the second transistor group is controlled to turn on by the third control voltage, here, the second control voltage may be Vp and the third control voltage may be Vn, for example, Vp is controlled to be a low voltage and Vn is controlled to be a high voltage, where the low voltage refers to a lower voltage that can make the transistors M6, M8 and M9 turn off and make the transistor M12 turn on at the same time, such as 0 V, but is not specifically limited; the low voltage here refers to a lower voltage that can make the transistors M5, M7, M11 turn on and make the transistor M10 turn off at the same time, such as 2.5V or 3 V, but is not specifically limited. At this time, the first transistor groups M6, M8, M9 and M10 are turned off, and the second transistor groups M5, M7, M11 and M12 are turned on. The simplified equivalent circuit diagram of the reconfigurable current control voltage source circuit shown in FIG. 9 is shown as FIG. 11A. The reconfigurable current control voltage source circuit operates in the decreasing function mode, and its output bias voltage satisfies equation (2), in which, $V_C$ is the variable bias voltage, $R_V$ is the resistance, $I_C$ is the control current, and $V_{limit}$ is the power supply voltage which has the same value range with the foregoing $V_{limit}$.

$$V_C = V_{limit} - R_V \times I_C \tag{2}$$

Referring to FIG. 11B, a schematic diagram of the change curve of the bias voltage and the control current when the reconfigurable current control voltage source circuit operates in an increasing function mode is illustrated. As shown in FIG. 11B, $I_C$ is the control current, and $V_C$ is the bias voltage. In FIG. 11B, R3>R2>R1, when the resistance of the variable resistor is constant, the bias voltage decreases with the increase of the control current; when the control current is constant, the larger the resistance of the variable resistor, the smaller the bias voltage, and the resistance of the variable resistor is the slope of the straight line, that is, the proportional coefficient between the bias voltage and the control current can be adjusted by the resistance of the variable resistor.

It could be understood that from the foregoing, there is a corresponding relationship between the control current and the power of the input signal, and there is a corresponding relationship between the bias voltage and the control current, so that the corresponding relationship between the bias voltage and the power of the input signal can be obtained. Referring to FIG. 11C, a schematic diagram of the change curve of the bias voltage and the power of the input signal when the reconfigurable current control current source circuit operates in a decreasing function mode is illustrated. As shown in FIG. 11C, Pin is the power of the input signal, and $V_C$ is the bias voltage. In FIG. 11C, when the resistance of the variable resistor is constant, after Pin>Poffset, the bias voltage decreases with the increase of the power of the input signal; when the power of the input signal is constant, the larger the resistance of the variable resistor, the smaller the bias voltage.

It can be understood that from the foregoing, the equivalent capacitance of the phase shifting transistor varies with the gate voltage (bias voltage) thereof, and a compensation phase that decreases with the increase of the equivalent capacitance can be introduced by the phase shifting transistor, and there is a corresponding relationship between the bias voltage and the power of the input signal, so that a corresponding relationship between the compensation phase and the power of the input signal can be obtained. Referring to FIG. 11D, a schematic diagram of the change curve of the compensation phase and the power of the input signal when the reconfigurable current control current source circuit operates in a decreasing function mode is illustrated. As shown in FIG. 11D, $\varphi_C$ is the compensation phase, Pin is the power of the input signal. In FIG. 11D, when the resistance of the variable resistor is constant, after Pin>Poffset, within the compensation range, the compensation phase increases with the increase of the power of the input signal, that is, the compensation phase changes in the same direction of the power of the input signal; when the power of the input signal is constant, the larger the resistance of the variable resistor, the larger the compensation phase.

Understandably, in the embodiment of the disclosure, the control current is determined based on the power of the input signal, the bias voltage is determined based on the control current, the equivalent capacitance is determined based on the bias voltage, the compensation phase is determined based on the equivalent capacitance, then the phase of the input signal is compensated by the compensation phase, and the compensated input signal is amplified by the radio frequency power amplifier to obtain the output signal. Referring to FIG. 11E, a schematic diagram of the change curve of the phase of the output signal and the power of the input signal when the reconfigurable current control voltage source circuit operates in a decreasing function mode is illustrated. As shown in FIG. 11E, Phase is the phase of the output signal, and Pin is the power of the input signal. Understandably, in an ideal state, the phase of the output signal is constant, but due to the AM-PM distortion, in some cases, the phase of the output signal will shift negatively with the increase of the power of the input signal. In FIG. 11E, after Pin>Poffset, in the original state without compensation, Phase-Pin curve is shown as "downbuckling". Because the AM-PM compensation circuit provided in the embodiment of the disclosure compensates the input signal before the signal is amplified, the phase of the input signal changes opposite to the phase distortion of the output signal, so that the phase of the output signal can be "pulled up" to make it closer to the ideal state. In FIG. 11E, R2>R1, and the Phase-Pin curve corresponding to R2 has a greater "pulled up" degree than that corresponding to R1, and the curve is closer to the ideal state, that is, the greater the resistance of the variable resistor, the greater the compensation degree of the AM-PM compensation circuit.

In the embodiment of the disclosure, the reconfigurable current control voltage source circuit provides the phase shifting transistor D1 with a variable bias voltage related to the power of the input signal, which makes the compensation phase introduced by D1 under different input powers variable, thus realizing the programmability of the change rate of AM-PM with the input power.

In some embodiments, the switching transistors M5, M6, M7, M8, M9, M11 may be Negative channel-Metal-Oxide- Semiconductor (NMOS) transistors; the switching transistors M10 and M12 can be Positive channel-Metal-Oxide-Semiconductor (NMOS) transistors.

In the embodiment of the disclosure, the phase of the input signal is corrected by the method of adding a phase shifting transistor (e.g. MOS transistor) D1 to ground at the input end of the radio frequency power amplifier, so that the phase of the input signal changes opposite to the phase distortion of the output signal to realize AM-PM compensation. Since the phase change of the input signal is the compensation phase introduced by the MOS capacitor (the equivalent capacitor of the MOS transistor), and the capacitance of the MOS capacitor and its gate voltage meet the relationship shown in FIG. 6, by reasonably controlling the gate voltage of the MOS capacitor, phase compensations with different degrees can be performed, thereby realizing the adjustability of the change rate of AM-PM with the input signal.

The variation of the gate voltage of the appropriate MOS capacitor is realized by the detection circuit and the reconfigurable current control voltage source circuit. The output current (i.e., the control current) of the detection circuit and the radio frequency input power (i.e., the power of the input signal) meet the relationship shown in FIG. 5, and the preset power threshold can be adjusted by the first control voltage of the detection circuit; however, the variable bias voltage output by the reconfigurable current control voltage source circuit has two modes of the increasing function or the decreasing function with the control current. In the circuit shown in FIG. 9, by controlling the control voltages Vp and Vn of the switching transistors to achieve the switching of the operation mode, finally, the output voltage and the control current of the reconfigurable current control voltage source in the two operation modes meet the functional relationship as shown in FIG. 10B or FIG. 11B, in which the variable resistor $R_V$ realizes the variability of the proportional relationship between the bias voltage and the control current.

In some embodiments, the variable resistor $R_V$ has the following variants.

Figure 12A:
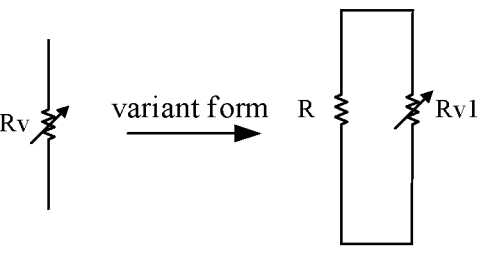
FIG. 12A is a schematic diagram of a form of a variable resistor provided by an embodiment of the disclosure.

FIG. 12A illustrates a schematic diagram of one variant of a variable resistor provided by an embodiment of the disclosure. As shown in FIG. 12A, the resistance is changed by the parallel connection of a fixed resistor R and a variable resistor $R_V1$.

Figure 12B:
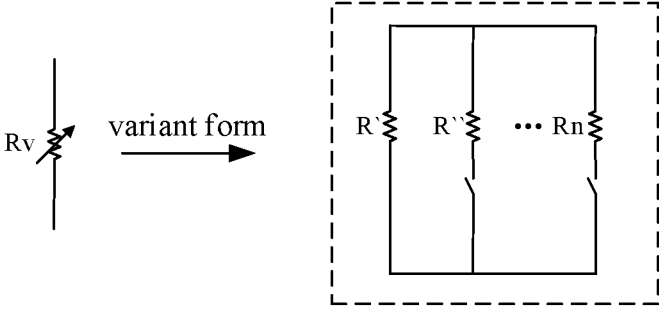
FIG. 12B is a schematic diagram of another form of a variable resistor provided by an embodiment of the disclosure.

FIG. 12B illustrates schematic diagram of another variant of a variable resistor provided by an embodiment of the disclosure. As shown in FIG. 12B, the resistance is changed through the parallel connection of multiple fixed resistors R', R" . . . Rn, in which part of the fixed resistors are switched by controlling switches.

Figure 12C:
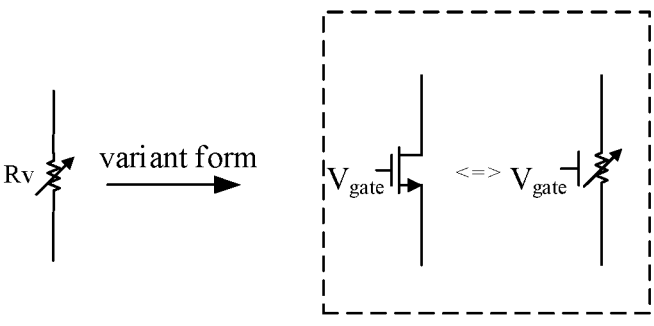
FIG. 12C is a schematic diagram of yet another form of a variable resistor provided by an embodiment of the disclosure.

FIG. 12C illustrates schematic diagram of yet another variant of a variable resistor provided by an embodiment of the disclosure. As shown in FIG. 12C, the resistance is changed by a MOS transistor as a controllable linear resistor.

In another possible embodiment, the variable resistor is constant, the area ratio of the current mirror is variable at this time. Specifically, in some embodiments, the reconfigurable current control voltage source circuit comprises at least one current mirror module which is composed of two transistors.

The reconfigurable current control voltage source circuit is configured to adjust the compensation degree of the compensation circuit to the AM-PM distortion of the radio frequency power amplifier by adjusting the area ratio of the current mirror module.

Figure 13:
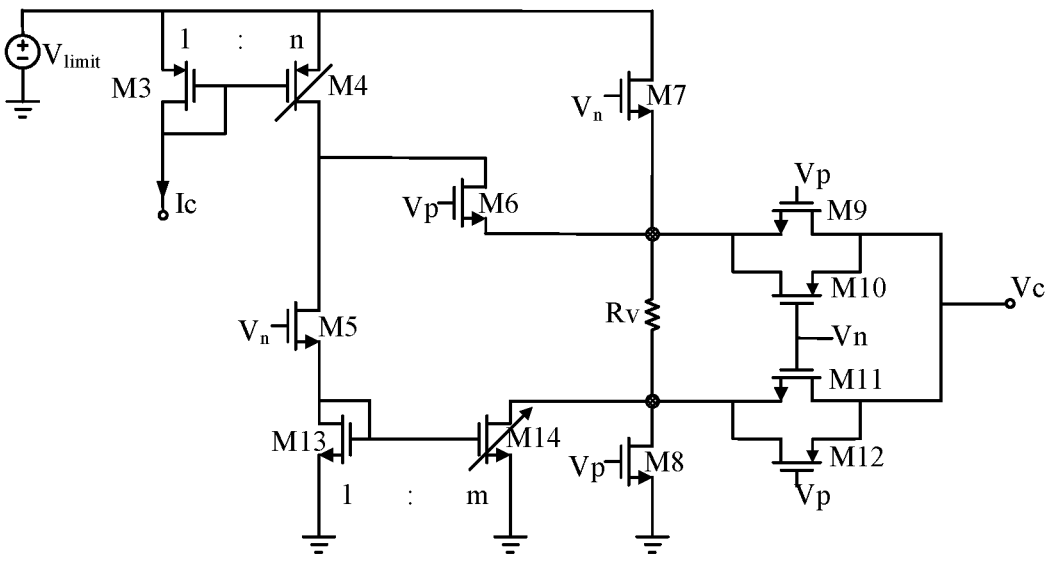
FIG. 13 is a schematic diagram of the specific structure of another reconfigurable current control voltage source circuit provided by an embodiment of the disclosure.

Exemplarily, FIG. 13 illustrates a schematic diagram of the specific structure of another reconfigurable current control voltage source circuit provided by an embodiment of the disclosure; As shown in FIG. 13, it is similar to the reconfigurable current control voltage source circuit shown in FIG. 9, except that $R_V$ is a linear resistor, M3 and M4 constitute a 1:n current mirror, and M13 and M14 constitute a 1:m current mirror. The compensation degree of the AM-PM compensation circuit is adjusted by changing the multiple of the current flowing through the resistor $R_V$ and the input current in the reconfigurable current control voltage source. For example, by changing the area ratio of M4 to M3 or M14 to M13, the change rate of AM-PM with input power can be programmed and controlled. Of course, those skilled in the art can also make adjustments in other feasible ways and the embodiments of the disclosure are not specifically limited.

In the embodiments of the disclosure, by the joint effect of the detection circuit and the reconfigurable current control voltage source circuit, the bias voltage and the power of the input signal meets the function relationship as shown in FIG. 10C or FIG. 11C. Such a gate voltage is applied to a phase shifting transistor (for example, a MOS transistor, whose equivalent capacitor is referred to a MOS capacitor), so that the compensation phase introduced by the MOS capacitor has varying degrees of change with the power of the input signal after a specific power point (a preset power threshold), as shown in FIG. 10D or FIG. 11D. Because the radio frequency input signal corrected by the embodiment of the disclosure will generate phase change and the change value is the compensation phase introduced by the phase shifting transistor, the phase of the output signal of the amplifier can be adjusted with the power of the input signal, that is, the change rate of AM-PM (Phase) with the input power can be programmed, as shown in FIG. 8. Because the operation mode of the reconfigurable current control voltage source circuit determines whether the compensation phase changes in the same direction or in the opposite direction with the power of the input signal, proper selection of the operation mode of the reconfigurable current control voltage source can realize the AM-PM compensation under different AM-PM distortion situations, as shown in FIG. 10E or FIG. 11E, in which the first control voltage determines the power point at which the AM-PM compensation is turned on, and the variable resistor $R_V$ or the current mirror module of the reconfigurable current control voltage source circuit determines the degree of the AM-PM compensation, that is, the change rate of AM-PM with the input signal is adjustable.

In some embodiments, the amplification circuit includes one second transistor; or, the amplification circuit comprises multiple second transistors, which form a stacked tube structure.

Figure 14:
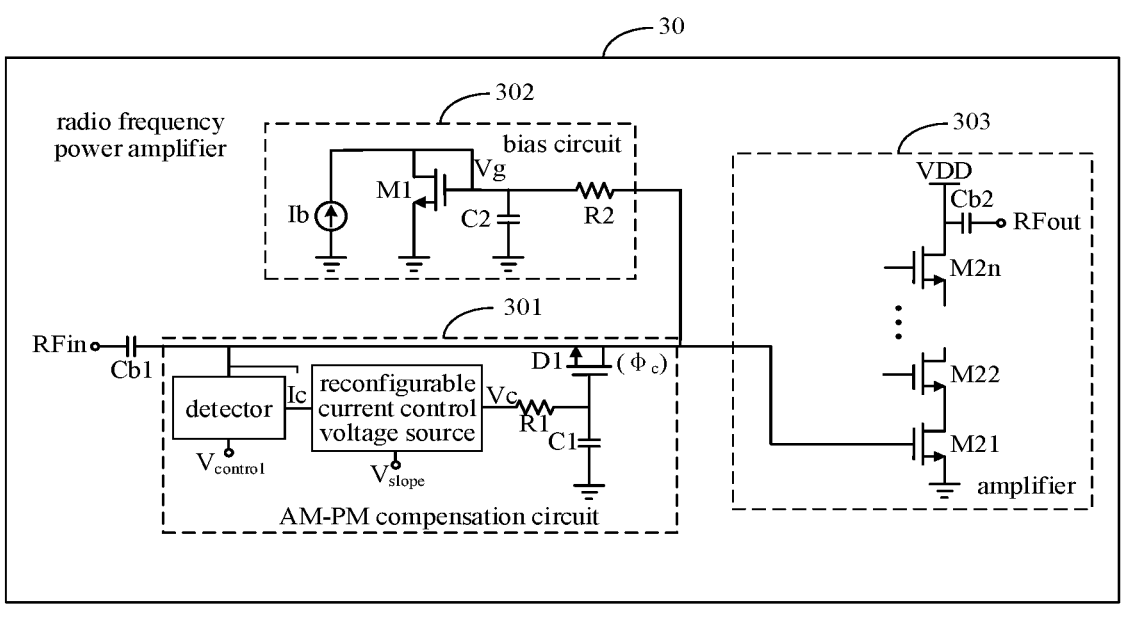
FIG. 14 is a schematic diagram of the circuit structure of another radio frequency power amplifier provided by an embodiment of the disclosure.

FIG. 14 illustrates a schematic diagram of the circuit structure of another radio frequency power amplifier provided by an embodiment of the disclosure. It should be noted that, in the radio frequency power amplifier shown in FIG. 14, the detection circuit in the aforementioned embodiment may be integrated into a detector, the reconfigurable current control voltage source circuit in the aforementioned embodiment may be integrated into a reconfigurable current control voltage source, and the amplifier is an amplification circuit.

It should also be noted that, when the amplification circuit includes one second transistor, the circuit structure diagram is shown as FIG. 7. When the amplification circuit includes multiple second transistors, the circuit structure diagram is shown as FIG. 14 and the compensation circuit and the bias circuit are the same as those in the embodiment shown in FIG. 8 and will not repeated here. In addition, the difference between FIG. 7 and FIG. 14 is that, in the radio frequency power amplifier shown in FIG. 14, the number of second transistors is multiple (n, n is an integer greater than or equal to 2), and multiple second transistors M21, M22 . . . M2n form a stacked tube structure, which can perform multi-stage amplification on the input signal.

It should also be noted that, the transistors in the embodiments of the disclosure are not limited to MOS transistors, and may be other types of power transistors, such as heterojunction bipolar transistor (HBT), bipolar junction transistor (BJT) and the like.

In the embodiment of the disclosure, by providing a compensation circuit of amplitude modulation-phase modulation at the input end of the radio frequency amplification circuit. The compensation circuit comprises a detection circuit, a reconfigurable current control voltage source circuit and a phase shifting circuit, in which, the detection circuit is configured to detect the power of an input signal and output a control current according to the power of the input signal when the power of the input signal is greater than a preset power threshold; the reconfigurable current control voltage source circuit is configured to generate a bias voltage according to the control current; the phase shifting circuit is configured to compensate the AM-PM distortion of the radio frequency power amplifier according to the bias voltage, so that the phase of the input signal changes opposite to the phase distortion of the output signal to realize AM-PM compensation.

The embodiments of the disclosure provide a radio frequency power amplifier comprising a compensation circuit of amplitude modulation-phase modulation. The power of the input signal is detected by a detection circuit, and when the power of the input signal is greater than a preset power threshold, the detection circuit outputs a control current according to the power of the input signal, and the compensation circuit is turned on to compensate at different power points by a first control voltage source; the reconfigurable current control voltage source circuit outputs a bias voltage according to the control current output by the detection circuit, and makes it operate in the increasing function mode or the decreasing function mode by the second control voltage source, and adjusts the compensation degree by the variable resistor or the current mirror module; the phase shifting transistor performs AM-PM compensation according to the bias voltage. In this way, the detection circuit controls the power point at which the AM-PM compensation is turned on. The reconfigurable current control voltage source circuit determines the compensation direction and the compensation degree of the AM-PM compensation. The phase shifting transistor performs phase compensation to the input signal, so that the change rate of AM-PM (Phase) with the input signal is adjustable, and the applicability is good, so that the AM-PM distortion produced by the radio frequency power amplifier during signal amplification is reduced, thereby improving the signal quality and the ALRC performance of the radio frequency power amplifier. The circuit achieved in this solution is relatively simple, and the design is flexible. By adjusting the parameters (such as the first control voltage, the resistance of the variable resistor, the area ratio of the current mirror, etc.) of the compensation circuit, the power point at which the AMPM compensation is turned on and the phase of the AM-PM compensation can be programmed and adjusted, which has the advantages of good applicability, simple circuit, easy integration and low cost.

Figure 15:
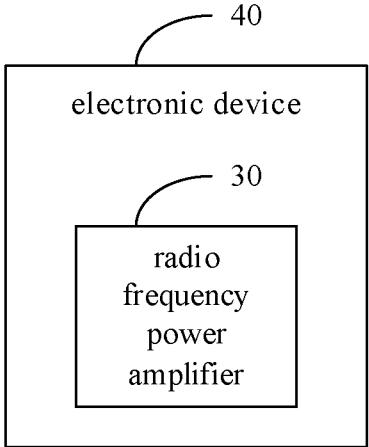
FIG. 15 is a schematic diagram of the structure of an electronic device provided by an embodiment of the disclosure.

In yet another embodiment of the disclosure, referring to FIG. 15, a schematic diagram of the structure of an electronic device provided by an embodiment of the disclosure is illustrated. As shown in FIG. 15, the electronic device 40 includes at least the radio frequency power amplifier 30 described in the foregoing embodiments.

In this way, as for the electronic device 40, because the radio frequency power amplifier therein includes an AM-PM compensation circuit. According to the specific description of the aforementioned embodiment, in this way, by the cooperation of the detector, the reconfigurable current control voltage source circuit and the phase shifting transistor in the AM-PM compensation circuit, the phase of the input signal changes opposite to the phase distortion of the output signal, thereby realizing AM-PM compensation, and improving signal quality and ALRC performance of the radio frequency power amplifier, and the circuit is simple and easy to be integrated, and the cost is reduced at the same time.

It should be noted that, in this disclosure, terms "include", "comprise" or any other variation thereof are intended to encompass non-exclusive inclusion, so that a process, method, article or device that includes a set of elements includes not only these elements but also other elements that are not explicitly listed, or further includes elements inherent to such process, method, article or device. In the absence of further limitations, the element defined by the phrase "including a . . . " does not preclude the existence of another identical element in the process, method, article or device in which it is included.

The above serial numbers of the embodiments of the disclosure are for description only and do not represent the advantages and disadvantages of the embodiments.

The methods disclosed in the method embodiments provided by the disclosure may be combined arbitrarily without conflict to obtain new method embodiments.

The features disclosed in the product embodiments provided by the disclosure may be combined arbitrarily without conflict to obtain new product embodiments.

The features disclosed in the method embodiments or device embodiments provided by the disclosure may be combined arbitrarily without conflict to obtain new method embodiments or device embodiments.

In the compensation circuit of amplitude modulation-phase modulation, the radio frequency power amplifier and the device provided in the embodiments of the disclosure, the compensation circuit comprises a detection circuit, a reconfigurable current control voltage source circuit and a phase shifting circuit, in which, the detection circuit is configured to detect the power of an input signal and outputs a control current according to the power of the input signal when the power of the input signal is greater than a preset power threshold; the reconfigurable current control voltage source circuit is configured to generate a bias voltage according to the control current; the phase shifting circuit is configured to compensate the amplitude modulation-phase modulation AM-PM distortion of the radio frequency power amplifier according to the bias voltage. In this way, by the compensation circuit, when the power of the input signal is greater than a preset power threshold, the AM-PM distortion of the radio frequency power amplifier can be compensated according to the power of the input signal, thereby reducing the AM-PM distortion generated during signal amplification, and improving the signal quality and the ACLR performance of the radio frequency power amplifier, and having simple circuit and easy integration.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A compensation circuit of amplitude modulation-phase modulation of a radio frequency power amplifier, comprising a detection circuit, a reconfigurable current control voltage source circuit, and a phase shifting circuit, wherein the detection circuit is configured to detect a power of an input signal and output a control current to the reconfigurable current control voltage source circuit according to the power of the input signal when the power of the input signal is greater than a preset power threshold that is adjustable and represents a power point at which compensation is turned on;

the reconfigurable current control voltage source circuit is configured to generate a bias voltage according to the control current; and the phase shifting circuit is configured to compensate an amplitude modulation-phase modulation AM-PM distortion of the radio frequency power amplifier according to the bias voltage;

wherein the detection circuit is configured to only detect the power of the input signal but not output the control current when the power of the input signal does not reach the preset power threshold; and wherein when the power of the input signal is equal to the preset power threshold, the compensation is turned on, while the control current equals 0.

2. The compensation circuit of claim 1, wherein the compensation circuit further comprises a first control voltage source, which is connected with the detection circuit;

the first control voltage source is configured to output a first control voltage; and the detection circuit is further configured to adjust the preset power threshold according to the first control voltage.

3. The compensation circuit of claim 1, wherein the compensation circuit further comprises a second control voltage source, which is connected with the reconfigurable current control voltage source circuit;

the second control voltage source is configured to output a second control voltage and a third control voltage; and the reconfigurable current control voltage source circuit is further configured to control a corresponding relationship between the bias voltage and the control current according to the second control voltage and the third control voltage.

4. The compensation circuit of claim 3, wherein the corresponding relationship comprises an increasing function relationship or a decreasing function relationship; wherein the increasing function relationship indicates that the bias voltage increases with an increase of the control current, and the decreasing function relationship indicates that the bias voltage decreases with the increase of the control current.

5. The compensation circuit of claim 4, wherein the reconfigurable current control voltage source circuit comprises a first transistor group and a second transistor group, and both the first transistor group and the second transistor group comprise multiple switching transistors;

the reconfigurable current control voltage source circuit is specifically configured to control that the bias voltage and the control current have the increasing function relationship when the first transistor group is controlled to turn on according to the second control voltage and the second transistor group is controlled to turn off according to the third control voltage; or, the reconfigurable current control voltage source circuit is specifically configured to control that the bias voltage and the control current have the decreasing function relationship when the first transistor group is controlled to turn off according to the second control voltage and the second transistor group is controlled to turn on according to the third control voltage.

6. The compensation circuit of claim 1, wherein the reconfigurable current control voltage source circuit comprises a variable resistor; and the reconfigurable current control voltage source circuit is configured to adjust a compensation degree of the compensation circuit to the AM-PM distortion of the radio frequency power amplifier by adjusting a resistance of the variable resistor.

7. The compensation circuit of claim 1, wherein the reconfigurable current control voltage source circuit comprises at least one current mirror module which is composed of two transistors; and the reconfigurable current control voltage source circuit is configured to adjust the compensation degree of the compensation circuit to the AM-PM distortion of the radio frequency power amplifier by adjusting an area ratio of the current mirror module.

8. The compensation circuit of claim 1, wherein the phase shifting circuit comprises a phase shifting transistor; and the phase shifting circuit is specifically configured to adjust an equivalent capacitance of the phase shifting transistor according to the bias voltage and compensate the AM-PM distortion of the radio frequency power amplifier according to the equivalent capacitance.

9. A radio frequency power amplifier, comprising the compensation circuit of claim 1.

10. The radio frequency power amplifier of claim 9, wherein the radio frequency power amplifier further comprises a bias circuit and an amplification circuit, and both the compensation circuit and the bias circuit are connected with a signal input end of the amplification circuit;

the compensation circuit is configured to compensate the AM-PM distortion of the radio frequency power amplifier based on the input signal, to obtain a compensated input signal;

the bias circuit is configured to provide a bias current for the amplification circuit; and the amplification circuit is configured to power amplify the compensated input signal based on the bias current.

11. The radio frequency power amplifier of claim 9, wherein the amplification circuit comprises one amplification transistor; or, the amplification circuit comprises multiple amplification transistors, which form a stacked tube structure.

12. The radio frequency power amplifier of claim 9, wherein the detection circuit, the reconfigurable current control voltage source circuit and the phase shifting circuit are cooperatively operated such that when the power of the input signal is greater than the preset power threshold, the AM-PM distortion of the radio frequency power amplifier is compensated according to the power of the input signal, thereby reducing the AM-PM distortion generated during signal amplification, and improving signal quality and ACLR performance of the radio frequency power amplifier.

13. An electronic device, comprising the radio frequency power amplifier of claim 9.

* * * * *